Figure 1:
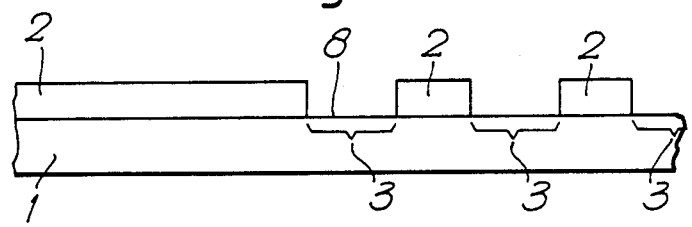

United States Patent [19]

Nicholas

[11] Patent Number: 4,746,587
[45] Date of Patent: May 24, 1988

[54] ELECTRON EMISSIVE MASK FOR AN ELECTRON BEAM IMAGE PROJECTOR, ITS MANUFACTURE, AND THE MANUFACTURE OF A SOLID STATE DEVICE USING SUCH A MASK

[75] Inventor: Keith H. Nicholas, Reigate, England

[73] Assignee: U.S. Philips Corporation, New York, N.Y.

[21] Appl. No.: 903,044

[22] Filed: Sep. 2, 1986

[30] Foreign Application Priority Data

Sep. 20, 1985 [GB] United Kingdom ............... 8523298

[51] Int. Cl.$^4$ ............................................. G03F 9/00
[52] U.S. Cl. ...................................... 430/5; 430/296; 430/321; 430/324; 430/325; 430/942; 250/492.2; 250/492.3; 250/503.1
[58] Field of Search .................. 430/5, 296, 323, 324, 430/325, 321, 942; 250/492.24, 492.3, 503.1

[56] References Cited

U.S. PATENT DOCUMENTS 4,137,458  1/1979  King et al. ............... 250/492.24
4,377,627  3/1983  Vinton ......................... 430/22
4,426,584  1/1984  Bohlen et al. ............... 250/492.2

Primary Examiner—John E. Kittle
Assistant Examiner—Jose G. Dees
Attorney, Agent, or Firm—Robert T. Mayer

[57] ABSTRACT

The mask part 41 includes a substrate 1, a patterning means 40 and a photoemissive layer 6. The patterning means 40 includes a mask pattern 2, 3 of apertures 3 and masking areas 2 and a modifying layer 4. Ultraviolet radiation 56 is patterned by patterning means 40 before effecting electron emission 60 from the photoemissive layer 6. There is electron emission from over the apertures 3 and the masking areas 2 as the masking areas are partially transparent to incident ultraviolet radiation. The ultraviolet transmitted by the apertures and the masking areas is modified in intensity dependent on the thickness R of the modifying layer. The resuting electron emission 60 is in a patterned beam which forms a proximity effect corrected electron image of the mask pattern in the electron sensitive resist layer 63. The masking areas 2 of chromium and the modifying layer 4 of resist may be made by modifications of known methods of chromium deposition and resist exposure and development. The use of the mask in the manufacture of a solid state device allows a single exposure of a resist layer 63 to form a proximity effect corrected image of the mask pattern 2, 3 in the resist layer 63.

18 Claims, 2 Drawing Sheets

ELECTRON EMISSIVE MASK FOR AN ELECTRON BEAM IMAGE PROJECTOR, ITS MANUFACTURE, AND THE MANUFACTURE OF A SOLID STATE DEVICE USING SUCH A MASK

The invention relates to an electron emissive mask for an electron beam image projector and to a method of manufacturing such a mask, and further relates to a method of manufacturing a solid state device by a method including the use of such a mask.

An electron emissive mask, for exposing an electron sensitive resist using an electron beam image projector is known in which the mask includes a substrate transparent to ultraviolet radiation, patterning means on a major surface of the substrate for patterning the ultraviolet radiation transmitted by the substrate, and a photoemissive coating responsive to ultraviolet radiation and present over the patterning means. The patterning means comprises a mask pattern having apertures transparent to ultraviolet radiation and masking areas whereby ultraviolet radiation transmitted by the pattern apertures effects photoemission of electrons in a corresponding pattern from the photoemissive coating. In known masks the masking areas are opaque to ultraviolet radiation.

In an electron beam image projector a patterned electron beam emitted from such a mask is imaged by a combination of electric and magnetic fields onto an electron sensitive resist layer provided on a solid state device body. The patterned electron beam exposes the resist so that subsequent processing of the exposed resist forms a resist pattern on the device body which is an image of the mask pattern.

The accuracy of reproduction of the mask pattern in the resist is limited by, among other things, the proximity effect due to the backscatter of electrons from the resist layer and underlying device body which gives a variable background exposure in the resist layer. Areas of resist exposed to electrons generated by parts of the mask pattern having a high average transmission (i.e. pattern apertures and multiple adjacent pattern apertures) receive a higher electron dose than, and are overexposed relative to, areas of resist exposed to parts of the mask pattern having a low average transmission. The proximity effect in electron beam lithography is described by T. H. P. Chang in The Journal of Vacuum Science and Technology (J. Vac. Sci. Technol.) Vol. 12, No. 6, November/December 1975.

A known method of correction for the proximity effect is described in The Journal of Applied Physics (J. Appl. Phys) Vol. 54, No. 6, June 1983. The method of correction is applicable to both electron beam image projectors and scanned electron beam pattern generators. The proximity effect may be corrected for by subsequently overwriting the exposure effected by the first patterned beam with a second, correction exposure. This second electron exposure of the resist layer is a reduced dose negative of the first exposure projected out of focus. The conditions of the second correction exposure are adjusted to mimic the backscattered electron background from the first exposure so that the total background dose due to both backscattered electrons from the first exposure and the second correction exposure is constant and the exposed resist layer, when developed, forms the desired pattern. This method is known as a GHOST proximity effect correction.

In a scanned electron beam pattern generator the second correction exposure may be made by manipulation of the program used to control the first exposure and the correction exposure may be made without any change having to be made to the pattern generator hardware.

In an electron beam image projector however, the first exposure is made with a first mask, having the desired pattern to be reproduced in the resist pattern, and the second, correction exposure is made with a second mask having a pattern which is the negative of the desired pattern. To give the proximity effect correction exposure the second mask pattern is projected out of focus, and the exposure is stopped when the dose of electrons from photoemission effected by transmission of ultraviolet through a second mask pattern aperture is approximately 35% of the electron dose from photoemission effected by transmission of ultra-violet through a first mask pattern aperture.

The need to use two masks in proximity effect correction in an electron beam image projector may result in alignment errors between the first exposure and the second, correction exposure and is time and effort consuming in that two masks need to be made and the electron beam image projector must be reconfigured between each exposure. The reconfiguring of the image projector includes changing the mask, evacuating the projector, ensuring the projection of the correction exposure is correctly aligned and altering the electric or magnetic or both fields to defocus the image.

According to a first aspect of the invention there is provided an electron emissive mask for exposing an electron sensitive resist using an electron beam image projector, which mask includes a substrate transparent to ultraviolet radiation, patterning means on a major surface of the substrate for patterning the ultraviolet radiation transmitted by the substrate, and a photoemissive coating responsive to ultraviolet radiation and present over the patterning means, the patterning means comprising a mask pattern having apertures transparent to ultraviolet radiation and masking areas, whereby ultraviolet radiation transmitted by the pattern apertures effects photoemission of electrons in a corresponding pattern from the photoemissive coating, characterised in that the masking areas are partially transparent to the ultraviolet radiation transmitted by the substrate, in that the patterning means further comprises a modifying layer to modify ultraviolet radiation transmitted by the apertures and by the masking areas of the mask pattern, and in that the transparency of the modifying layer to the ultraviolet radiation varies dependent on position with respect to the mask pattern whereby the ultraviolet radiation transmitted to the photoemissive coating effects photoemission of electrons from the photoemissive coating over the apertures and over the masking areas to provide a patterned electron beam which forms a proximity effect corrected image of the mask pattern in the electron sensitive resist layer.

Such a mask removes the need for a first and a second electron emissive mask and consequently there is no requirement to reconfigure the electron beam image projector between resist exposures and there is no need to fabricate two electron emissive masks.

The partial transparency of the modifying layer reduces the intensity of ultraviolet radiation transmitted from the mask pattern to the photoemissive layer, the reduction being dependent on position with respect to the mask pattern in accordance with the proximity effect correction required to ensure accurate reproduction of the mask pattern. The partial transparency of the masking areas of the mask pattern allows transmission of ultraviolet radiation to the photoemissive layer to effect emission of electrons over a masking area at an intensity governed by the transparency of the modifying layer. This electron emission is a negative of the desired image of the mask pattern at a reduced intensity which varies depending on the transparency of the modifying layer.

The modifying layer of a mask in accordance with the invention may be formed in various ways. It is particularly convenient to form the modifying layer from a selectively-exposed and developed resist which provides an edge degraded negative pattern of the masking areas. The partial transparency of the modifying layer can be varied by varying the composition of the layer, for example by introducing an ultraviolet absorbing material into the modifying layer. However, it is convenient to obtain the variation in transparency by having variations in the thickness of the layer dependent on position with respect to the mask pattern. The resist may be hardened by radiation to render it less transparent to ultraviolet radiation.

The resist may be polymethyl methacrylate, a well known and well characterised positive working electron sensitive resist.

The masking areas of the mask pattern may be formed of metal, for example chromium, and may be partially transparent to between 20% and 45% of incident ultraviolet radiation. The use of chromium masking areas in electron beam image projector masks is known and the chromium may be made to a required thickness for masks in accordance with the invention by altering the chromium deposition conditions.

According to a second aspect of the invention there is provided a method of manufacturing an electron emissive mask for exposing an electron sensitive resist using an electron beam image projector, which method includes the steps of forming a mask pattern comprising masking areas and apertures on a major surface of a mask substrate, and depositing a photoemissive coating responsive to at least ultraviolet radiation over the mask pattern, characterised in that the masking areas of the mask pattern are formed of masking material in a thickness which is partially transparent to ultraviolet radiation, and the method further includes the step of forming a modifying layer over the apertures and masking areas of the mask pattern before depositing the photoemissive coating, the modifying layer having a transparency to ultraviolet radiation which varies dependent on position with respect to the mask pattern whereby the ultraviolet radiation transmitted to the photoemissive coating effects photoemission of electrons from the photoemissive coating over the apertures and over the masking areas to provide a patterned electron beam which forms a proximity effect corrected image of the mask pattern in the electron sensitive resist layer.

The step of forming the modifying layer may include the steps of coating the mask pattern with an electron sensitive resist layer, exposing the electron sensitive resist layer to electron irradiation in a scanned electron beam pattern generator, developing the exposed resist to provide an exposed resist thickness which varies dependent on position with respect to the mask pattern, and rendering the exposed and developed resist less transparent to ultraviolet radiation by hardening with radiation. In the step of forming the mask pattern an electron beam pattern generator may be used to define the pattern of masking areas and apertures, and pattern information which was used to define the electron exposure for the mask pattern may subsequently be used in an edge-degraded format to expose the resist layer in the form of the modifying layer.

The exposure dose of the resist in the pattern generator may vary dependent on the ultra-violet transparency of the mask pattern masking areas and apertures to give an exposure dose in accordance with the required proximity effect corrected electron beam to be emitted by the mask.

Thus an electron emissive mask in accordance with the invention for an electron beam image projector may be made by a novel combination of mask making and resist processing techniques to yield a desired mask structure of a mask substrate having on it a mask pattern, the masking areas of which are partially transparent, overlying the mask pattern a partially transparent modifying layer formed of electron exposed, developed, radiation hardened resist which is in turn overlain by a photoemissive coating.

The developed resist may be radiation hardened by means of ion implantation. Ion implantation is a widely practiced process in the manufacture of solid state devices which may be easily modified for the implantation of the resist. Ion implantation of an exposed and developed resist pattern in the manufacture of a photomask is described by B. A. McIver in J. E. Electrochem Soc.: Solid State Science and Technology April 1982, Vol. 129, No. 4, pp 827–830.

The resist may be positive working, for example polymethyl methacrylate, spun on to a thickness of about 1 micrometer over the substrate. Such a resist thickness when exposed, developed and ion implanted with, for example, phosphorus or silicon ions to a dose of between $10^{13}$ and $10^{16}$ ions cm$^{-2}$ has a transparency which decreases with increasing thickness and varies dependent on position relative to the mask pattern in accordance with the required proximity effect corrected electron beam to be emitted by the mask.

According to a third aspect of the invention, there is provided a method of manufacturing a solid state device characterised by the step of exposing an electron sensitive resist layer provided on a solid state device body to a patterned beam of electrons emitted by an electron emissive mask which is in accordance with a first aspect of the invention, whereby the interaction of the patterned beam with the resist layer forms a proximity effect corrected image of the mask pattern in the layer.

Figure 2:
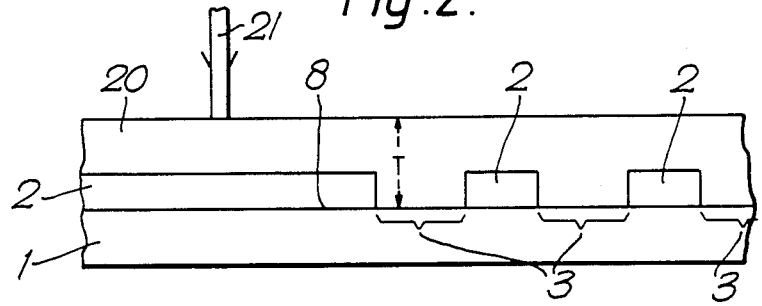
Figure 3:
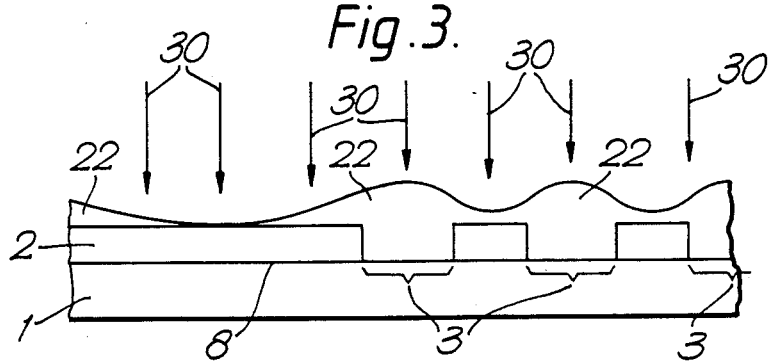
Figure 4:
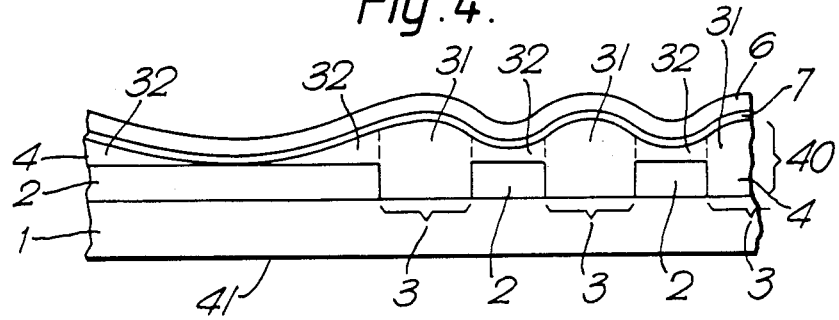
Figure 5A:
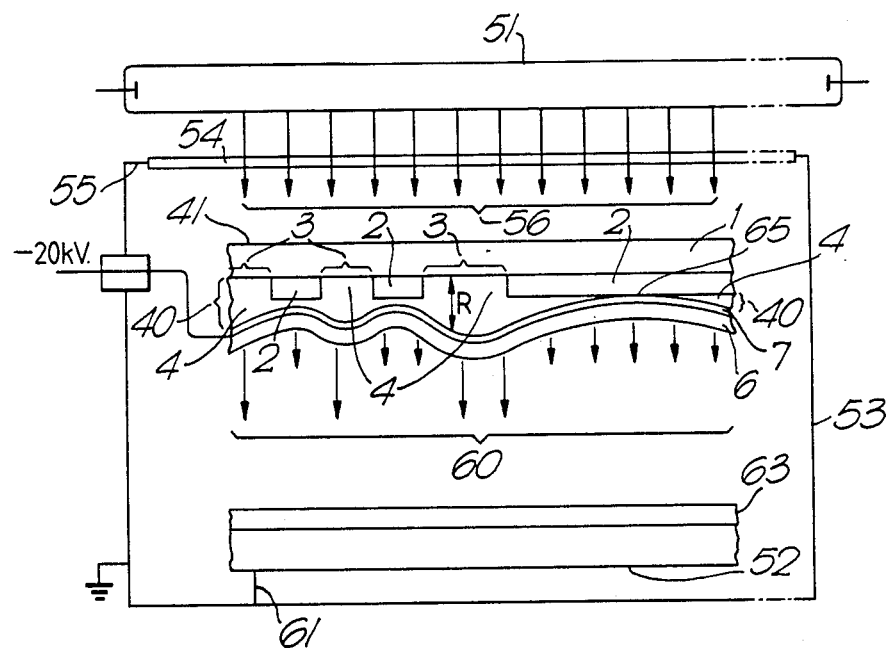
Figure 5B:
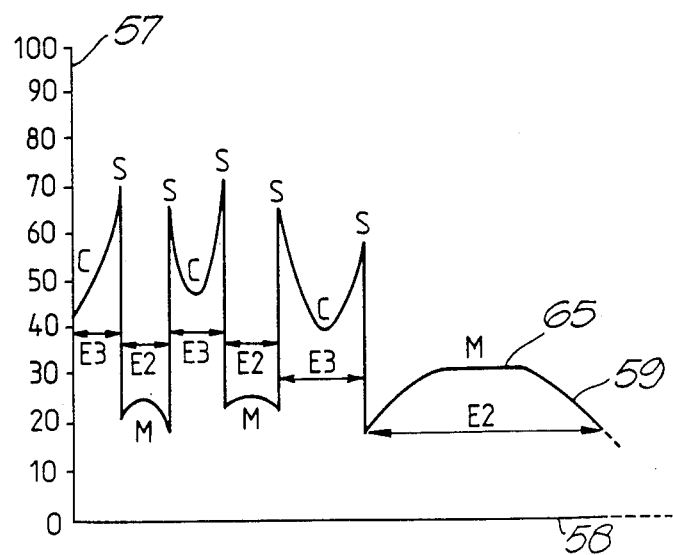

Embodiments of the invention will now be described by way of example only with reference to the accompanying drawings, in which:

FIGS. 1 to 3 are cross sectional views of part of an electron emissive mask for an electron beam image projector at successive stages of its manufacture in accordance with a second aspect of the invention, FIG. 4 is a cross sectional view of part of such an electron emissive mask in accordance with a first aspect of the invention, FIG. 5A shows schematically a stage in a method of manufacturing a solid state device which includes the step of using an electron emissive mask in accordance with a first aspect of the invention, and FIG. 5B is a schematic graphical representation of the ultraviolet transparency and electron emission characteristics of an electron emissive mask in accordance with a first aspect of the invention.

It is to be understood that the drawings are diagrammatic and not to scale, in particular the relative thickness and changes in thickness of various parts of the mask have been exaggerated for the sake of convenience.

The structure of the mask of FIG. 4 will now be described after which its manufacture will be described with reference to FIGS. 1, 2 and 3.

FIG. 4 shows a part 4*l* of an electron emissive mask for exposing an electron sensitive resist 63 using an electron beam image projector as shown in FIG. 5A. The mask includes a substrate 1 transparent to ultraviolet radiation, means 40 on a major surface 8 of the substrate for patterning ultraviolet radiation transmitted by the substrate and a photoemissive coating 6 responsive to ultraviolet radiation on the patterning means 40. The patterning means 40 includes a mask pattern 3, 2 having apertures 3 transparent to ultraviolet radiation and masking areas 2. The masking areas 2 are partially transparent to ultraviolet radiation transmitted by the substrate 1. The patterning means 40 further includes a modifying layer 4 to modify ultraviolet radiation transmitted by the apertures 3 and by the masking areas 2 of the mask pattern. The transparency of the modifying layer 4 to ultraviolet radiation varies dependent on position with respect to the mask pattern 3, 2 whereby the ultraviolet radiation transmitted to the photoemissive coating 6 effects photoemission of electrons from the photoemissive coating 6 over the apertures 3 and over the masking areas 2 to provide a patterned electron beam which forms a proximity effect corrected electron image of the mask pattern 3, 2 in the electron sensitive resist 63. The modifying layer comprises parts 31 at the pattern apertures 3 and parts 32 which extend over at least a part of the masking areas 2 of the mask. The modifying layer 4 is formed from a selectively-exposed and developed resist which provides an edge degraded negative pattern of the masking areas 2. The mask also includes a thin sputter deposited chromium layer 7, of uniform thickness, for example, between 5 and 10 nanometers and uniform transparency, for example, between 99 and 95% respectively to the ultra-violet radiation transmitted by the patterning means 40. This thin chromium layer 7 provides an equipotential surface for the mask beneath the photoemissive layer 6 when the mask is in use in an electron beam image projector and has been included in previously known electron emissive masks.

FIG. 1 shows a stage in a method of making an electron emissive mask in accordance with the invention, after the step of providing a mask pattern 3, 2 comprising masking areas 2 and pattern apertures 3 on the major surface 8 of mask substrate 1. The masking areas 2 are formed from a layer of chromium, sputter deposited to a thickness which is sufficiently thin to be partially transparent for example to between 20% and 45% of incident ultraviolet radiation at a wavelength of, for example, 185 nanometers. In accordance with the GHOST proximity effect correction, however, the chromium of the masking areas 2 may have a transparency of, for example, approximately 35% of incident ultraviolet radiation at 185 nanometers wavelength for which a chromium thickness of approximately 40 nanometers is required.

The pattern of the masking areas 2 is defined using electron lithography in an electron beam pattern generator. The deflection of the electron beam in the pattern generator is controlled in known manner by the pattern information fed to the electron beam deflection circuits. Apart from the thickness of the chromium layer of the masking areas 2 the provision of a mask pattern 2, 3 on a mask substrate 1 for a mask in accordance with the invention can be carried out in a known manner and will not be described further.

FIG. 2 shows a further stage in the manufacture after a positive working electron sensitive resist layer 20 of, for example, polymethyl methacrylate (PMMA) with a thickness T over the substrate of, for example, approximately 1 micrometer has been spun on to fill the apertures 3 of the mask pattern and to cover the mask pattern of masking areas 2 and apertures 3. The resist layer 20 is shown undergoing exposure to electron radiation in the form of an electron beam 21. Using a scanned electron beam pattern generator the electron beam is deflected to expose the resist layer to electron radiation in a pattern and to an exposure dose in accordance with the required proximity effect corrected electron image in resist 63. The use of the known technique of developing the exposed resist layer 20 with a fast developer for a short time (to give a low gamma development) provides a developed exposed resist pattern 22, as shown in FIG. 3, the thickness of which is dependent on the electron radiation exposure dose of beam 21. The electron exposure dose for the positive working resist 20 is determined using the same pattern information which was used to define the electron exposure for the mask pattern 2,3. However this pattern information is now used in an edge-degraded format to define the resist pattern 22. This electron exposure dose varies with the transparency to ultraviolet radiation of the masking areas 2 and apertures 3 of the mask pattern 2,3 and with the average transparency of each part of the mask. Thus where the ultraviolet transparency is high, as at an aperture, the electron exposure dose is also high leading to a thicker developed resist pattern 22 than over another masking area 2. If, for example, the average transmission of the part 41 of the mask is high, the average electron dose will also be high, leading to on average a greater thickness of developed resist pattern 22 in the modifying layer than on other parts of the mask of lower average transmission. The required correction is not constant across a masking area 2 or aperture 3, hence the electron dose and consequent resist 22 thickness may be zero above an extensive masking area 2 and rise to a maximum value over an extensive aperture 3. The thickness of the developed resist may vary between zero and, for example, approximately 1 micrometer and the overall effect is to define the resist pattern 22 which is an edge-degraded negative of the mask pattern 2,3. In FIG. 3 a further step of rendering the exposed and developed resist 22 less transparent at least to ultraviolet radiation is illustrated. The resist is hardened by means of ion implantation from ion beam 30. The ions may comprise for example phosphorus ions or silicon ions and a dose between $10^{13}$ and $10^{16}$ ions cm$^{-2}$ is sufficient for the radiation hardening of PMMA. An electron flood may be used to prevent charging of the resist during the ion implantation, alternatively a thin conducting layer (for example 100 Å of aluminium) may be evaporated onto the resist and earthed during the implantation to prevent charge build-up on the resist. During the ion implantation chemical crosslinking occurs within the resist to decrease the transparency of the exposed and developed resist to ultraviolet radiation.

After the step of radiation hardening, the exposed and developed resist 22 becomes the modifying layer 4 of FIG. 4. The manufacture of the mask is completed by the provision of a thin chromium layer 7 over the modifying layer and any pattern areas not covered by the modifying layer and a photoemissive coating 6 (of for example, Caesium Iodide) which is responsive to ultraviolet radiation at a wavelength of 185 nanometers. Methods of providing the thin chromium layer 7 and the photoemissive coating 6 are well known.

In FIG. 5A, the mask part 41 is contained within a vacuum envelope 53 of an electron beam image projector. The mask forms a cathode member of the image projector, a solid state device body of which part 52 is shown having an electron sensitive resist layer 63 forms an anode member of the image projector. The device body 52 and resist layer 63 are electrically connected by strap 61 to the vacuum envelope 53 which may be earthed, and in accordance with the operating practice of an image projector the cathode member is held at, for example, $-20$ kV when the image projector is in operation.

An ultraviolet lamp 51 illuminates the mask part 41 via an ultraviolet transmitting window 54 in a wall 55 of the vacuum envelope 53.

Uniform ultraviolet radiation 56 from the lamp 51 traverses the mask substrate 1 and is patternd by the the patterning means 40 before effecting electron emission 60 from the photoemissive layer 6. The masking areas 2 are partially transparent to ultraviolet and the modifying layer 4 has a transparency to ultraviolet radiation which is variable, is dependent on the thickness of the modifying layer, (decreasing with increasing thickness R), and is dependent on position with respect to the mask pattern. Thus ultraviolet radiation transmitted by the patterning means 40 effects emission of electrons in a patterned beam 60 from the photoemissive coating 6 which produces a proximity effect corrected image of the mask pattern 2,3 in the resist layer 63.

The transmission of ultraviolet through the patterning means 40 and the emission of electrons from the photoemissive coating 6 are shown schematically in FIG. 5B. In a photoemissive mask the electron emission (FIG. 5A) from each point on the photoemissive coating 6 is proportional to the intensity of ultraviolet radiation reaching each point on the coating. This intensity is in turn proportional to the transparency of the patterning means 40 between the substrate surface 8 and each point on the coating 6. In FIG. 5B the ordinate 57 represents on a percentage scale both the transparency of the patterning means 40 and the electron (photo)emission from the coating 6 at each point across the mask part 41 represented by abscissa 58. 0% indicates zero transparency of the patterning means and no electron emission as would be found at a masking area of a known mask and 100% indicates the complete transparency of the patterning means and hence maximum electron emission as would be found at a pattern aperture of a known mask. The electron emission of the photoemissive layer 6 follows the same curve 59 as the transparency in FIG. 5B. In accordance with the requirement for proximity effect correction on interaction of the electron beam 60 with the resist layer 63 on the solid state device body 52 the electron emission from the photoemissive layer 6 varies as shown by curve 59 in FIG. 5B. The emission from over each pattern aperture 3 and masking area 2 varies across their width as shown by E3 and E2 respectively in FIG. 5B. To prevent overexposure at the centre C of each aperture the electron emission from the photoemissive layer 6 is reduced relative to that at the edge S of each aperture. To prevent underexposure at the center M of each masking area the masking areas 2 are partially transparent and the electron emission from the photoemissive layer at the edge S of each masking area is reduced relative to that at the centre M to correct for proximity effect exposure from the adjacent pattern aperture. The part 32 of the modifying layer 4 has zero thickness at the centre 65 of an extensive pattern area and the modifying layer may reach a maximum thickness of, for example, 1 micrometer at the centre of an extensive pattern aperture. The electron beam 60 is accelerated by the 20 KV potential difference applied between the mask part 41 and the body 52. The accelerated patterned electron beam 60 impinges on and exposes electron sensitive resist layer 63 provided on the device body 52. The electron beam forms a proximity effect corrected image of the mask pattern in the resist layer and thus, in a method of manufacturing a solid state device, in accordance with the third aspect of the invention, a single exposure may provide an electron sensitive resist layer with an exposure to a proximity effect corrected electron image of the mask pattern.

A method in accordance with the third aspect of the invention may be used in the manufacture of various types of solid state devices, including surface acoustic wave, magnetic bubble and semiconductor devices.

I claim:

1. An electron emissive mask for exposing an electron sensitive resist using an electron beam image projector, which mask includes a substrate transparent to ultraviolet radiation, patterning means on a major surface of the substrate for patterning the ultraviolet radiation transmitted by the substrate, and a photoemissive coating responsive to ultraviolet radiation and present over the patterning means, the patterning means comprising a mask pattern having apertures transparent to ultraviolet radiation and masking areas, whereby ultraviolet radiation transmitted by the pattern apertures effects photoemission of electrons in a corresponding pattern from the photoemissive coating, characterised in that the masking areas are partially transparent to the ultraviolet radiation transmitted by the substrate, in that the patterning means further comprises a modifying layer to modify ultraviolet radiation transmitted by the apertures and by the masking areas of the mask pattern, and in that the transparency of the modifying layer to the ultraviolet radiation varies dependent on position with respect to the mask pattern whereby the ultraviolet radiation transmitted to the photoemissive coating effects photoemission of electrons from the photoemissive coating over the apertures and over the masking areas to provide a patterned electron beam which forms a proximity effect corrected electron image of the mask pattern in the electron sensitive resist layer.

2. A mask as claimed in claim 1, in which the modifying layer is formed from a selectively-exposed and developed resist which provides an edge degraded negative pattern of the masking areas.

3. A mask as claimed in claim 2, in which the resist is polymethyl methacrylate.

4. A mask as claimed in any one of the preceding claims, in which the thickness of modifying layer varies dependent on position with respect to the mask pattern, the transparency of the modifying layer being dependent on its thickness.

5. A mask as claimed in claim 4, in which the masking areas are formed of metal.

6. A mask as claimed in claim 5, in which the metal is chromium.

7. A mask as claimed in claim 4, in which the masking areas are between 20% and 45% transparent.

8. A method of manufacturing a solid state device, characterised by the step of exposing an electron sensitive resist layer provided on a solid state device body to a patterned beam of electrons emitted by an electron emissive mask as claimed in claim 4, whereby the interaction of the patterned beam with the resist layer forms a proximity effect corrected image of the mask pattern in the layer.

9. A method of manufacturing a solid state device, characterized by the step of exposing an electron sensitive resist layer provided on a solid state device body to a patterned beam of electrons emitted by an electron emissive mask as claimed in claim 5, whereby the interaction of the patterned beam with the resist layer forms a proximity effect corrected image of the mask pattern in the layer.

10. A method of manufacturing a solid state device, characterized by the step of exposing an electron sensitive resist layer provided on a solid state device body to a patterned beam of electrons emitted by an electron emissive mask as claimed in claim 6, whereby the interaction of the patterned beam with the resist layer forms a proximity effect corrected image of the mask pattern in the layer.

11. A method of manufacturing a solid state device, characterized by the step of exposing an electron sensitive resist layer provided on a solid state device body to a patterned beam of electrons emitted by an electron emissive mask as claimed in claim 7, whereby the interaction of the patterned beam with the resist layer forms a proximity effect corrected image of the mask pattern in the layer.

12. A method of manufacturing an electron emissive mask for exposing an electron sensitive resist using an electron beam image projector, which method includes the steps of forming a mask pattern comprising masking areas and apertures on a major surface of a mask substrate, and depositing a photoemissive coating responsive to at least ultraviolet radiation over the mask pattern, characterised in that the masking areas of the mask pattern are formed of masking material in a thickness which is partially transparent to ultraviolet radiation, and the method further includes the step of forming a modifying layer over the apertures and masking areas of the mask pattern before depositing the photoemissive coating, the modifying layer having a transparency to ultraviolet radiation which varies dependent on position with respect to the mask pattern whereby the ultraviolet radiation transmitted to the photoemissive coating effects photoemission of electrons from the photoemissive coating over the apertures and over the masking areas to provide a patterned electron beam which forms a proximity effect corrected electron image of the mask pattern in the electron sensitive resist layer.

13. A method as claimed in claim 12, in which the step of forming the modifying layer includes the steps of coating the mask pattern with an electron sensitive resist layer, exposing the electron sensitive resist layer to electron irradiation in a scanned electron beam pattern generator, developing the exposed resist to provide an exposed resist thickness which varies dependent on position with respect to the mask pattern, and rendering the developed resist less transparent to ultraviolet radiation by hardening with radiation.

14. A method as claimed in claim 13, in which in the step of forming the mask pattern an electron beam pattern generator is used to define the pattern of masking areas and apertures, and pattern information which was used to define the electron exposure for the mask pattern is subsequently used in an edge-degraded format to expose the resist layer in the form of the modifying layer.

15. A method as claimed in claim 14, in which the exposed and developed resist is radiation hardened by ion implantation.

16. A method as claimed in claim 15, in which the ion implantation dose is between $10^{13}$ and $10^{16}$ ions $cm^{-2}$.

17. A method as claimed in claim 16, in which the implanted ions are phosphorus ions or silicon ions.

18. A method as claimed in any one of claims 13 to 17, in which the resist coating the substrate is polymethyl methacrylate in a thickness of approximately 1 micrometer.

* * * * *